United States Patent [19]

Jordan et al.

[11] Patent Number: 5,566,749
[45] Date of Patent: Oct. 22, 1996

[54] STAMPED AND FORMED HEAT SINK

[75] Inventors: William D. Jordan, Dallas; Matthew C. Smithers, Lewisville, both of Tex.

[73] Assignee: Thermalloy, Inc., Dallas, Tex.

[21] Appl. No.: 544,060

[22] Filed: Oct. 10, 1995

Related U.S. Application Data

[63] Continuation of Ser. No. 226,632, Apr. 12, 1994, abandoned.

[51] Int. Cl.⁶ ............................... F28F 7/00; F28F 13/12
[52] U.S. Cl. ..................... 165/80.3; 165/122; 165/185; 165/125; 174/16.3; 257/722; 361/697
[58] Field of Search ................................. 165/80.3, 121, 165/122, 125, 185; 174/16.1, 16.3; 257/721, 722; 361/692, 694, 695, 697, 702, 703, 704, 707

[56] References Cited

U.S. PATENT DOCUMENTS

| | | | |
|---|---|---|---|
| 3,212,569 | 10/1965 | McAdam | 174/16.3 X |
| 4,481,525 | 11/1984 | Calabro et al. | 174/16.3 X |
| 4,611,238 | 9/1986 | Lewis et al. | 174/16.3 X |
| 4,720,771 | 1/1988 | Horton | 174/16.3 X |
| 4,884,331 | 12/1989 | Hinshaw | 29/558 |
| 5,251,101 | 10/1993 | Liu | 257/718 X |
| 5,299,632 | 4/1994 | Lee | 165/80.3 |
| 5,309,983 | 5/1994 | Bailey | 165/80.3 |
| 5,367,433 | 11/1994 | Blomquist | 165/80.3 X |

FOREIGN PATENT DOCUMENTS

| | | | |
|---|---|---|---|
| 10558 | 1/1992 | Japan | 257/722 |
| 6861 | 1/1992 | Japan | 257/722 |

OTHER PUBLICATIONS

AMP Low Insertion Force (LIF) PGA Socket for Intel 486 DX2 CPU Device, Supplement 65238, Issued Apr. 1992.
TCM®: Thermalloy Cooling Modules, Nov. 1991, Thermalloy Inc.
New Product Bulletin, "Heat Sink for INTEL 80486 and 80860 89–DS/233–6 (C)" 1989 Thermalloy, Inc.
Thermalloy Heat Sinks for ECL and CMOS, 91–DS/GA–5.

*Primary Examiner*—Leonard R. Leo
*Attorney, Agent, or Firm*—Woodcock Washburn Kurtz Mackiewicz & Norris

[57] ABSTRACT

A stamped and formed heat sink has a thermally conductive body including a base having a face adapted for attachment to an electronic device package. Stamped and formed heat dissipation elements extend from the edges of the base perpendicular to the base. The heat sink is formed in a progressive punch and die press so that a heat sink is produced on every stroke.

10 Claims, 4 Drawing Sheets

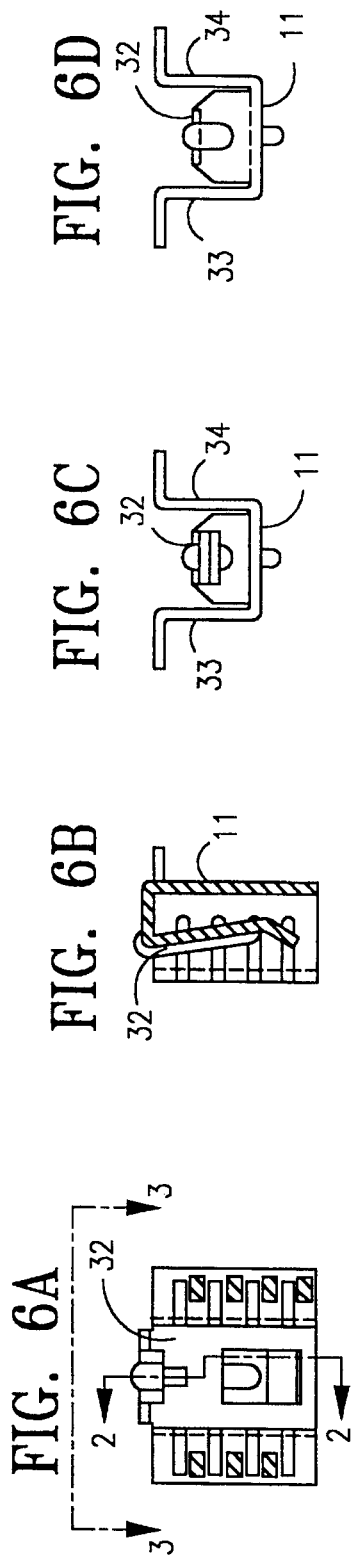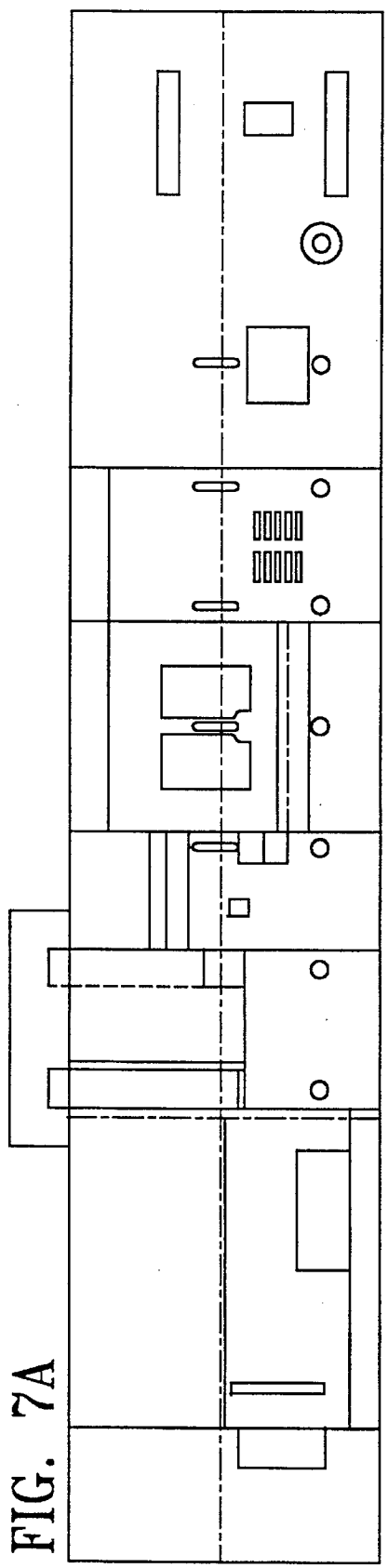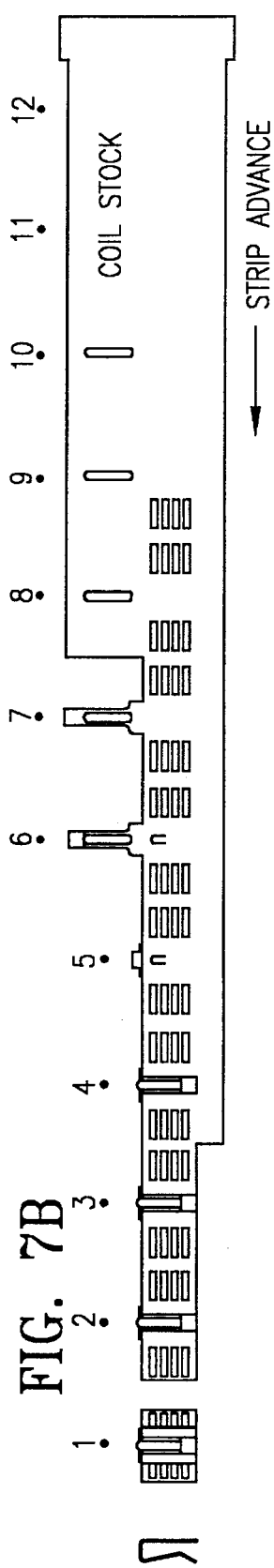

STAMPED AND FORMED HEAT SINK

This is a continuation of application Ser. No. 08/226,632, filed Apr. 12, 1994, now abandoned.

BACKGROUND OF THE INVENTION

This invention relates to dissipation of thermal energy generated by electronic devices. More particularly, it relates to miniaturized heat sink apparatus for dissipating thermal energy generated by semiconductor devices and the like into the surrounding environment and to methods of making such apparatus.

U.S. Pat. No. 4,884,331—Hinshaw describes heat sinks which have been successfully Used for semiconductor device packages. These heat sinks are generally quite small and are primarily designed for computer applications. Fans have been used in conjunction with such heat sinks to form miniature thermal cooling modules.

Other prior art apparatus generally comprises a plurality of thin parallel fins or pins longitudinally bonded within a rectangular housing. The housing may also comprise a compression chamber for reducing air into the fin section in order to provide a uniform flow of air through the fins.

A pin fin heat sink must be machined and requires several minutes per part to produce. Therefore, the labor cost for a pin fin heat sink is high. It is an object of the present invention to provide a stamped and formed heat sink which is considerably less expensive than a pin fin heat sink.

SUMMARY OF THE INVENTION

In accordance with the present invention, a heat sink has a face for attachment to an electronic device and stamped and formed heat dissipation elements extending from the edges of the base perpendicular to the base. The heat dissipation elements have openings for the flow of air through the body of the heat sink. The heat sink can be used either with a fan or in open air flow.

The heat dissipation elements are formed for an interference fit with a fan for forcing air through the heat dissipation elements. The fan can be snapped into the body of the heat sink for ease of assembly. Because it can be assembled without the use of screws or other attachment devices, the heat sink is more economical of manufacture. In the heat sinks of the prior art described above, screws are used to attach the fan to the heat sink, sometimes necessitating machining away pin fins and drilling and tapping a hole in the base of the heat sink for screw attachment.

The heat sink of the present invention also has the advantage that, in case of fan failure in the field, a new fan can be easily snapped into the old heat sink without the use of tools.

The stamped and formed heat sink of the present invention is considerably cheaper than a pin fin heat sink because it can be made in a progressive die in a punch press. The presses can be run from between 60 and 120 strokes per minute. A part is produced with every stroke. On the other hand, a pin fin heat sink must be machined and requires several minutes, per part, to produce. Therefore, the labor cost for the pin fin heat sink is considerably higher than that of the present invention. Also, more material is used in a pin fin heat sink than in a stamped and formed heat sink of the present invention.

SHORT DESCRIPTION OF THE DRAWINGS

FIG. 6A is a top plan view of another embodiment of the invention;

FIG. 6B is a side view of FIG. 6A;

FIG. 6C is a section on the line 2—2 of FIG. 6A;

FIG. 6D is a view on the line 3—3 of FIG. 6A;

FIG. 7A shows a top view of the die section of a progressive die and punch; and

FIG. 7B shows a progression strip of the heat sink being formed from coil stock.

DESCRIPTION OF THE PREFERRED EMBODIMENT

Figure 1:
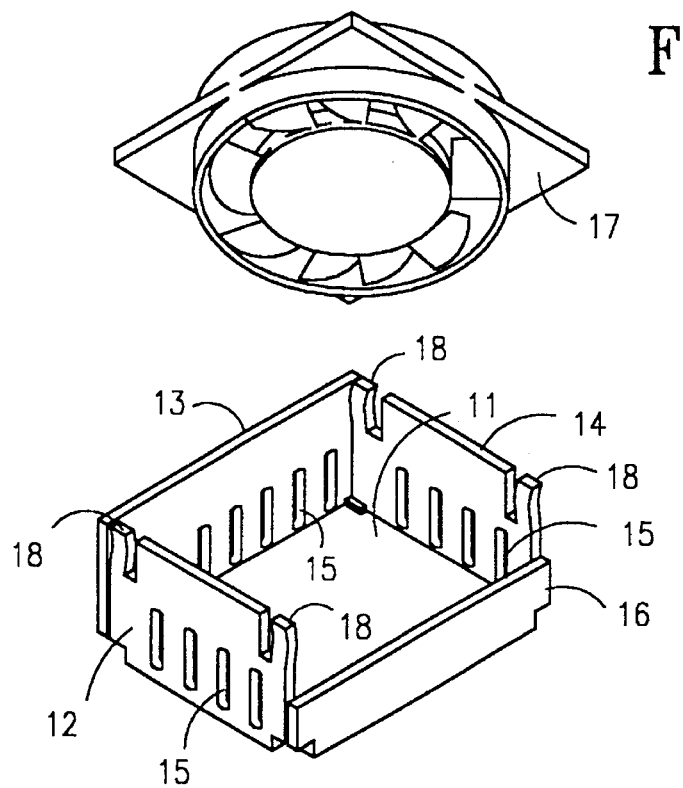
FIG. 1 shows one embodiment of a heat sink of the present invention.

Referring to FIG. 1, a heat sink comprises a thermally conductive body with a base 11. The underside of the base 11 is a face adapted for attachment to an electronic device package.

Stamped and formed heat dissipation elements 12, 13 and 14 extend from the edges of the base perpendicular to the base. These elements have openings 15 for the flow of air into the body of the heat sink. The heat dissipation element 16 has a height which is lower than the heat dissipation elements 12–14.

A fan 17 forces air through the heat dissipation elements toward the base 11. The heat dissipation elements 12–14 are formed for an interference fit with the fan 17 so that the fan can be snapped into the body of the heat sink.

Fingers 18, or detents, are formed from slots in the heat dissipation elements 12–14. The fingers 18 have beveled leading edges. As the fan is snapped into the body from the top, the beveled leading edges follow the contour of the fan. The fingers 18 are deformed, and they snap back into position to securely hold the fan in the body of the heat sink.

Figure 2:
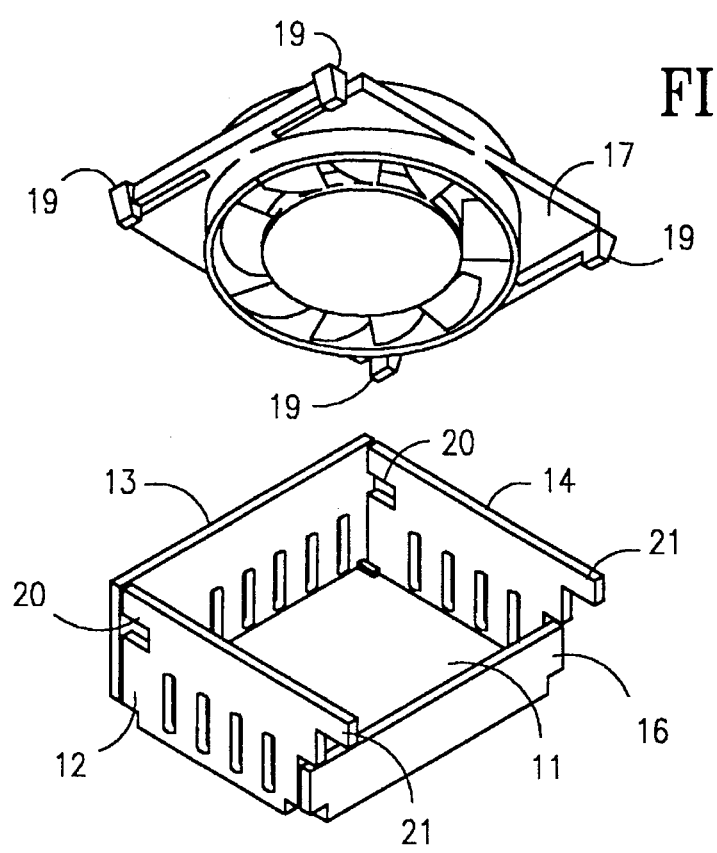
FIG. 2 shows an embodiment with plastic snap clips on the fan body to secure the fan to the body of the heat sink.

FIG. 2 shows an embodiment with plastic snap clips 19 on the fan body. The clips 19 at the rear of the fan pop into the holes 20 and the clips 19 at the front of the fan snap under the fingers 21 at the front of the heat sink body.

Figure 3:
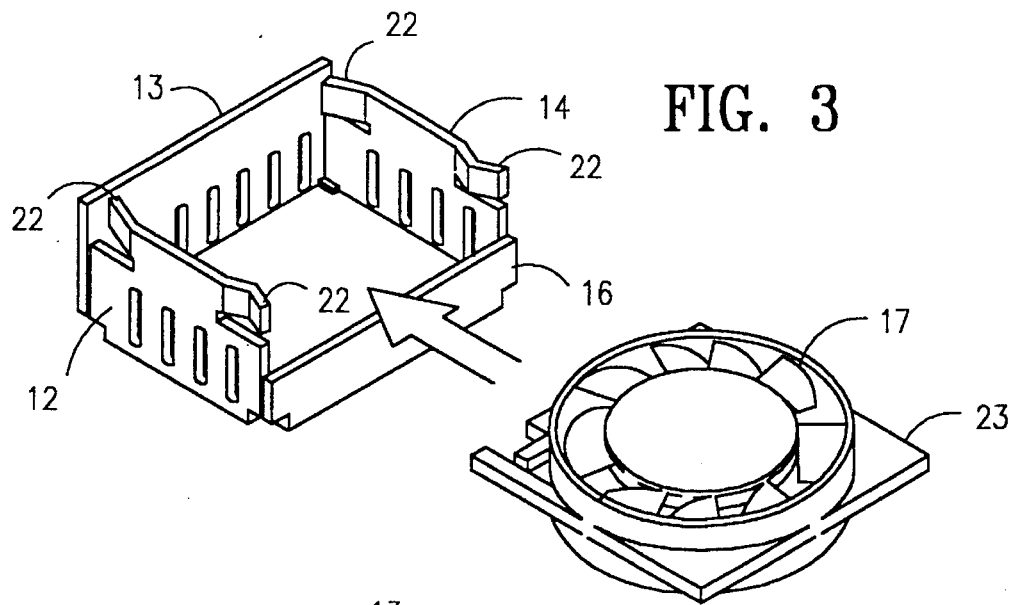
FIG. 3 shows an embodiment in which the fan snaps in from the side of the heat sink.

In FIG. 3, the fan 17 snaps into the body from the front. The fingers 22 are bent in to fit the curvature of the fan housing. The ledge 23 on the fan slides under the fingers 22 to prevent the fan from being lifted out. The curved part of the fan springs the fingers outward and the fingers fit against the fan. In the embodiments described so far, there is an interference with other items on top of the CPU. Therefore, the heat sink must be smaller than the fan in that area. Normally, the heat sink would be as large or larger than the fan.

FIGS. 4A–4E show an embodiment in which portions 24 and 25 of heat dissipation elements 12 and 14 are bent into the center of the body at an angle of 45°. These portions 24 and 25 provide better thermal performance and direct air swirling within the heat sink. The portions 24 and 25 form ledges on which the fan rests. The front edge of the fan rests on the top edge of the heat dissipation element 16 which has a lower height.

Figure 5:
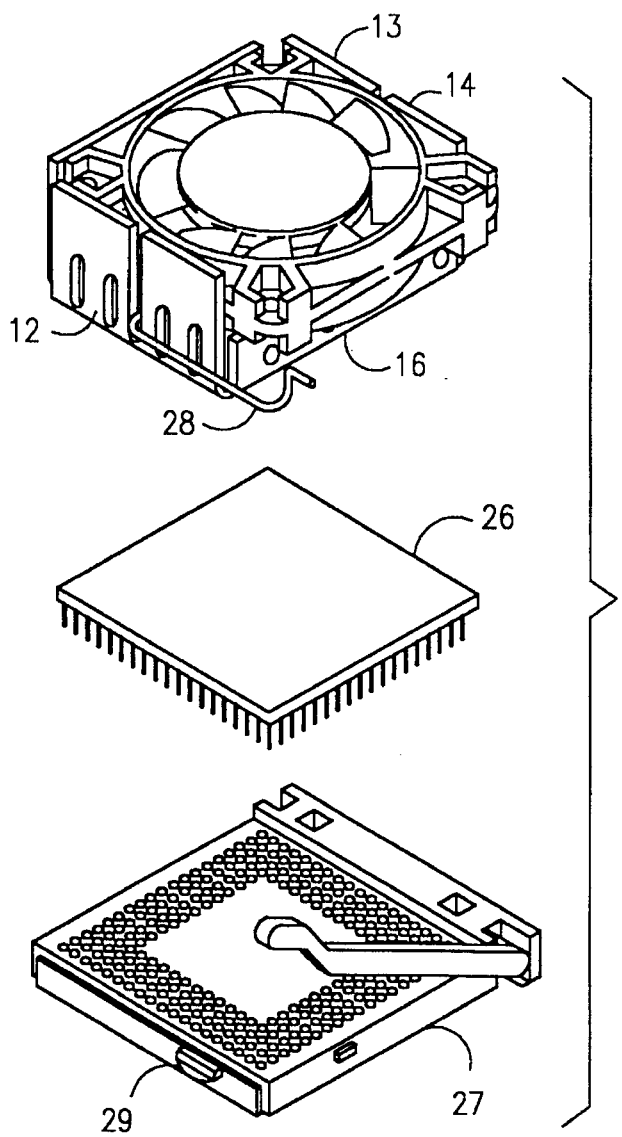
FIG. 5 shows the heat sink of the present invention with a pin grid array and a socket.
Figure 4D:
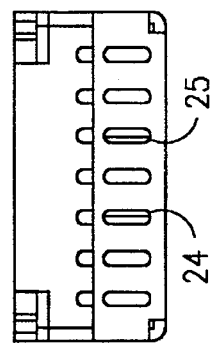
FIGS. 4B, 4C and 4D are back, side and front elevation views, respectively, of the heat sink of FIG. 4A.
Figure 4A:
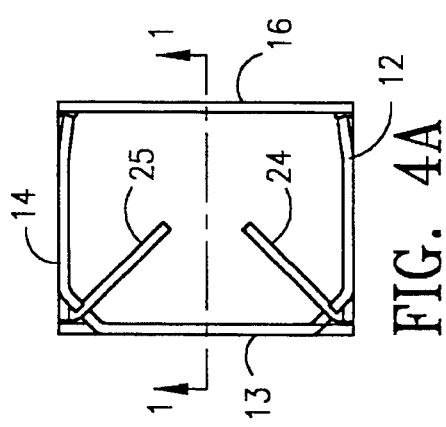
FIG. 4A is a top plan view of a heat sink.
Figure 4C:
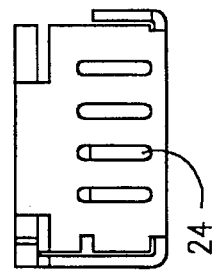
Figure 4E:
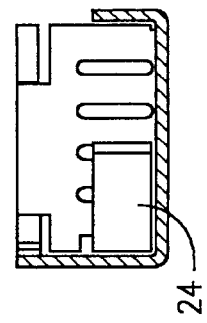
FIG. 4E is a view on the section 1—1 of FIG. 4A.
Figure 4B:
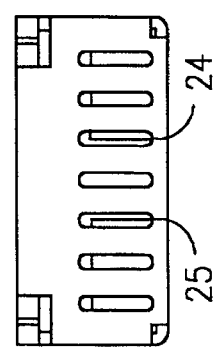

FIG. 5 is an exploded view of a heat sink in accordance with the present invention, with a pin grid array 26 and a socket 27 of the type supplied by AMP, Inc. A spring attachment 28 hooks under the catch 29 on the socket to secure together the package. Other means of attaching the heat sink to the electronic package can be used. A spring of the type shown in the publication AMP, Inc. Low Insertion Force (LIF) PGA socket for Intel 486DX2 CPU device Supplement 65238, issued April 1992, can be used to secure the stamped and formed heat sink to a socket. A single leaf of the spring can be used for attaching. The advantage of attaching the heat sink to ears on the socket is that the entire assembly of heat sink, microprocessor, and socket is held together. As heat sinks become larger and have more mass, heat sinks sometimes need to be assembled to the socket to pass shock and vibration tests.

FIGS. 6A, 6B, 6C and 6D show another modification of the stamped and formed heat sink which includes gull wing heat dissipation elements 30 and 31 extending from base 11. This heat sink is made by the die of FIG. 7A. A clip 32 secures the heat sink to a transistor.

FIG. 7A is a top view of a progression die which is used to form the heat sink of FIG. 6A–6D. FIG. 7B shows a progression strip for forming the heat sink of FIGS. 6A–6D. The die section of FIG. 7A has twelve stations which correspond with the twelve sections of the progression strip shown in FIG. 7B. The progression strip matches up with holes and slots in the die section of FIG. 7A. The top portion, or punch section, of the die is not shown. Upon each closure of the punch section on the die section, a stamped and formed heat sink is formed and the strip is advanced by one station. Stations numbers 4, 5 and 6 bend the clip 32 over. Station No. 1 forms the gull wings 33 and 34 and cuts the part away from the strip of coil stock. Sheets and strips of thermally conductive stock can also be used to form the heat sink.

While a particular embodiment of the invention has been shown and described, various modifications are within the true spirit and scope of the invention. The appended claims are, therefore, intended to cover all such modifications.

What is claimed is:

1. A heat sink for use with a fan to cool an electronic device comprising:

a thermally conductive sheet body forming a base having a face for attachment to said electronic device;

heat dissipation elements bent from said sheet body and extending from opposed edges of said base perpendicular to said base;

openings stamped in said heat dissipation elements for the flow of air into said body;

said heat dissipating elements being spaced for an interference fit with said fan, said fan being snapped into said heat dissipating elements; and detents formed by slots in said heat dissipating elements, said detents snapping over said fan when said fan is inserted into said heat sink apparatus.

2. The heat sink apparatus recited in claim 1 wherein said fan snaps into the top of said body.

3. The heat sink apparatus recited in claim 1 wherein said fan has plastic snap clips which engage fingers on two opposing heat dissipation elements in a snap fit.

4. The heat sink apparatus recited in claim 1 wherein one of said heat dissipation elements has a height which is lower than the other heat dissipation elements, the top edge of said heat dissipation element having lower height forming a ledge on which said fan rests.

5. The heat sink apparatus recited in claim 4 wherein said fan snaps into said body when said fan is inserted from the side on which said lower heat sink element extends.

6. The heat sink apparatus recited in claim 1 wherein two opposing heat dissipation elements have slots forming said detents and said fan has a housing, said detents snapping over said housing when said fan is inserted into said body.

7. The heat sink apparatus recited in claim 1 wherein a portion of at least one heat dissipation is bent into the center of said body to provide better thermal performance and to direct air swirling within said heat sink.

8. The heat sink apparatus recited in claim 7 further comprising:

said fan forcing air through said elements towards said base, said fan resting on an edge of said portion of said heat dissipation element.

9. The heat sink apparatus recited in claim 8 wherein two portions of two heat dissipation elements at the side of said body opposite said element having lower height are bent into the center of said body to form ledges on which said fan rests.

10. The heat sink apparatus recited in claim 1 wherein said electronic device package includes a socket and a pin grid array between said socket and said thermally conductive body; and means for attaching said thermally conductive body to said socket.

* * * * *